United States Patent [19]

Riedl

[11] Patent Number: 4,701,707
[45] Date of Patent: Oct. 20, 1987

[54] MAGNETIC RESONANCE DIAGNOSTIC DEVICE

[75] Inventor: Hermann Riedl, Erlangen, Fed. Rep. of Germany

[73] Assignee: Siemens Aktiengesellschaft, Berlin and Munich, Fed. Rep. of Germany

[21] Appl. No.: 781,452

[22] Filed: Sep. 30, 1985

[30] Foreign Application Priority Data

Oct. 26, 1984 [DE] Fed. Rep. of Germany ....... 3439331

[51] Int. Cl.⁴ .......................................... G01R 33/20
[52] U.S. Cl. .................................. 324/309; 324/313; 324/319
[58] Field of Search ............... 324/300, 307, 309, 318, 324/319, 320, 322, 312, 313

[56] References Cited

U.S. PATENT DOCUMENTS

| 4,333,053 | 6/1982 | Harrison et al. | 324/307 |
| 4,374,360 | 2/1983 | Sepponen | 324/309 |
| 4,417,209 | 11/1983 | Hounsfield | 324/309 |
| 4,516,074 | 5/1985 | Sugimoto | 324/309 |

FOREIGN PATENT DOCUMENTS

| 0076400 | 9/1982 | European Pat. Off. . |
| 0115642 | 12/1983 | European Pat. Off. . |
| 03135335 | 9/1981 | Fed. Rep. of Germany . |
| 2076542 | 5/1980 | United Kingdom . |
| 2128746 | 9/1983 | United Kingdom . |

Primary Examiner—Michael J. Tokar
Attorney, Agent, or Firm—Hill, Van Santen, Steadman & Simpson

[57] ABSTRACT

A magnetic resonance diagnostic device has a coil for generating a fundamental magnetic field of constant magnitude in which an examination subject is placed, a coil for generating a number of gradient magnetic fields in which the patient is also disposed, a device for detecting changes in the nuclear magnetic resonance of the patient from an equilibrium position, with the direction of the fundamental magnetic field being continuously changed during examination for inducing the changes in nuclear magnetic resonance which are measured.

14 Claims, 1 Drawing Figure

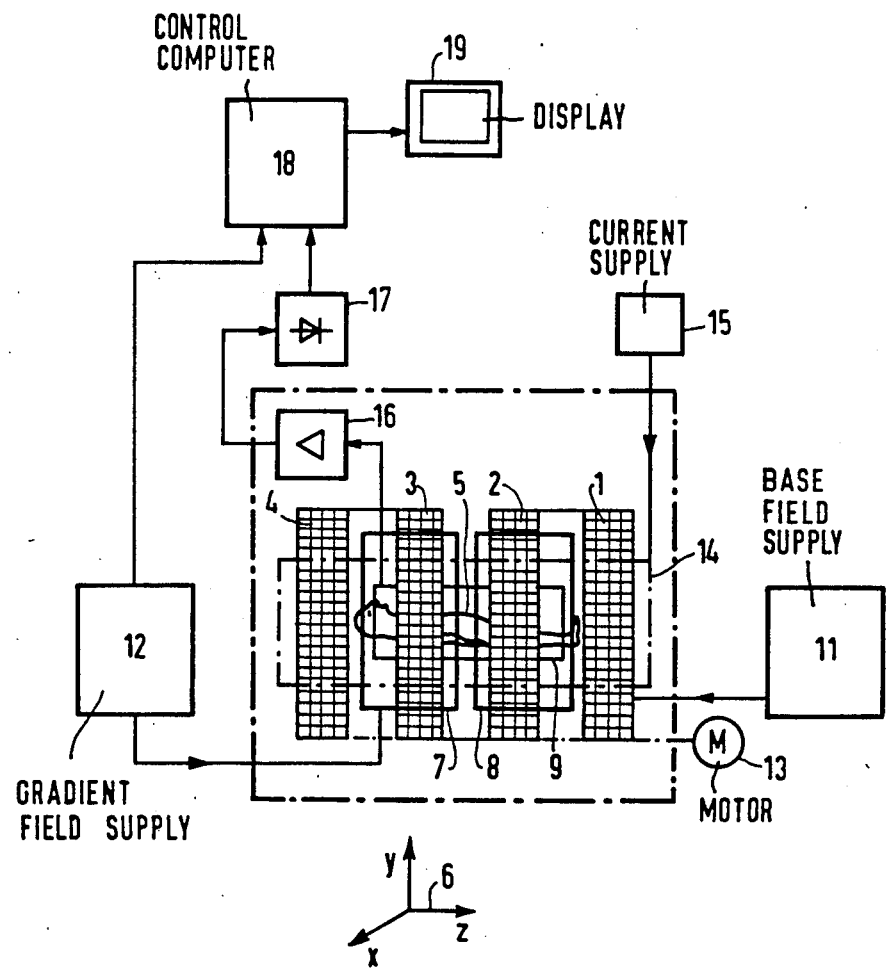

MAGNETIC RESONANCE DIAGNOSTIC DEVICE

BACKGROUND OF THE INVENTION

1. Field of the Invention

The present invention relates to magnetic resonance diagnostic devices.

2. Description of the Prior Art

Magnetic resonance or spin imaging diagnostic devices generally include coils for generating a fundamental magnetic field and gradient fields in which an examination subject is disposed, and at least one measuring coil for monitoring the change of nuclear spin of the examination subject from an equilibrium position due to the magnetic excitation pulses. A device of this type is described, for example, in German OS No. 31 35 335. This device generates movement of the nuclear spin of the examination subject out of an equilibrium position maintained by the fundamental magnetic field by the application of a high-frequency excitation pulse. A signal is generated when the nuclear spin returns to normal at the end of the excitation pulse. Given precession of the nuclear spin, the frequency of the signal is dependent upon the strength of the fundamental magnetic field. If the uniform fundamental magnetic field is superimposed with a field gradient so that the magnetic field distribution varies three-dimensionally, locating by means of the measured frequency is made possible. Visible images of the examination subject can be generated in this manner and by modifying the direction of the respective field gradient. The excitation in a slice or layer of the examination subject is achieved by selecting a further field gradient for acting upon the fundamental magnetic field such that excitation of nuclear magnetic resonance occurs only in the layer of interest. This is possible because such excitation occurs only with a frequency which is precisely associated with the magnetic field in the selected layer.

SUMMARY OF THE INVENTION

It is an object of the present invention to provide a magnetic resonance diagnostic device wherein the use of high frequency excitation pulses for inducing changes in the nuclear spin is not necessary.

The above object is inventively achieved in a magnetic resonance device wherein means are provided for undertaking a directional change of the fundamental magnetic field.

In magnetic resonance devices with static fundamental magnetic fields, a measured signal can only be obtained when nuclear magnetic resonances or spins or ensembles of resonances which comprise a resulting vectorial component perpendicular to the direction of the fundamental field. In order to generate a vectorial component of the magnetic resonance or of the nuclear magnetization perpendicular to the fundamental field, a high frequency auxiliary magnetic field has heretofore been employed as described above. Independently of the selected method for exciting the nuclear magnetic resonance, a change in the nuclear magnetization direction from an equilibrium position occurs, this being parallel to the direction of the fundamental field in its steady-state condition. In the device disclosed herein, the change in the direction of the nuclear magnetization relative to the fundamental magnetic field occurs by means of directional change, particularly by means of a continuous directional change of the fundamental magnetic field, given a constant magnitude for this field. After a directional change of the fundamental magnetic field by an angle of 90° in a time which is short in comparison to the spin grid relaxation time, the resulting nuclear magnetization is perpendicular to the direction of the fundamental magnetic field, so that a corresponding magnetic resonance signal can be measured. If a continuously rotating fundamental magnetic field is used, the nuclear magnetic resonances have an angular deviation relative to the fundamental magnetic field direction due to the continuously occurring relaxation process.

DESCRIPTION OF THE DRAWINGS

The single Figure shows a schematic representation of a nuclear magnetic resonance diagnostic device constructed in accordance with the principles of the present invention.

DESCRIPTION OF THE PREFERRED EMBODIMENTS

As shown in the drawing, a nuclear magnetic resonance diagnostic installation constructed in accordance with the principles of the present invention has coils 1, 2, 3 and 4 connected to a base field supply unit for generating a base or fundamental DC magnetic field. A patient 5 to be examined is disposed within this fundamental magnetic field. The installation also includes coils for generating orthogonal magnetic field gradients in the x, y and z directions as indicated at 6. For clarity, only gradient coils 7 and 8 are shown in the drawing, which generate the x-gradient in combination with a pair of identical gradient coils disposed opposite to the illustrated coils. Identical y-gradient coils (not shown) are disposed parallel to the patient 5 above and below the patient, and coils for the z-gradient field are disposed at the head and feet of the patient at right angles to the longitudinal axis of the patient 5. All gradient coils are supplied by a gradient field supply unit 12.

The installation also includes a detector coil 9 for detecting the nuclear magnetic resonance signals. The coils 1 through 9 are shown schematically surrounded by a dot-dash line and represent the actual examination instrument. The detector or measuring coil 9 supplies the detected signal through an amplifier 16 and a phase-sensitive rectifier 17 to a control computer or processor 18, also connected to the gradient field supply 12. The computer 18 processes the incoming signals and generates a signal for a display unit 19.

The measuring coil 9 is arranged in a known manner for displaying tomographs or image layers of the patient 5.

Changes in the direction of the nuclear magnetization relative to the fundamental magnetic field in the embodiment shown in the drawing are achieved by a directional change, particularly a continuous directional change, of the fundamental magnetic field, given a constant magnitude of this field. The gradient coils 7 and 8 can serve this purpose, the coils 7 and 8 generating directionally invariably or directionally variable field gradients. The field gradients are also variable in magnitude. Such a change in the fundamental magnetic field may also, however, be undertaken by mechanically rotating the coils 1 through 4 by driving connection to a motor 13. A further possibility for changing the fundamental magnetic field direction is to electrically rotate the field by means of a coil system 14 which is operated by a current supply unit 15. The current supply unit 15 supplies currents to the coil system 14 which are either phase-shifted, or in the form of chronologically offset pulses.

By changing the direction of the fundamental magnetic field, the application of high-frequency magnetic field pulses for changing the direction of the nuclear magnetization can be entirely omitted, however, it is also possible to utilize a combination of such high-frequency fields with directional changes in the fundamental field.

Although modifications and changes may be suggested by those skilled in the art it is the intention of the inventor to embody within the patent warranted hereon all changes and modifications as reasonably and properly come within the scope of his contribution to the art.

I claim as my invention:

1. A magnetic resonance diagnostic device comprising:
    means for generating a fundamental magnetic field of constant magnitude in which an examination subject is disposed;
    means for generating a plurality of gradient magnetic fields in which said examination subject is also disposed;
    means for detecting changes in the nuclear magnetic resonance of said examination subject from an equilibrium position; and
    means for continuously changing the direction of said fundamental magnetic field for inducing said nuclear magnetic resonance changes.

2. A device as claimed in claim 1 wherein said means for generating a plurality of gradient magnetic fields generates directionally invariable gradient magnetic fields.

3. A device as claimed in claim 1 wherein said means for generating a plurality of gradient magnetic fields generates directionally variable gradient fields.

4. A device as claimed in claim 1 wherein said means for generating a plurality of gradient magnetic fields generates magnitude variable gradient fields.

5. A device as claimed in claim 1 wherein said means for continuously changing the direction of said fundamental magnetic field is a means for mechanically rotating said means for generating a fundamental magnetic field.

6. A device as claimed in claim 1 wherein said means for continuously changing the direction of said fundamental magnetic field is a current supply means for said fundamental magnetic field which supplies phase-shifted currents.

7. A device as claimed in claim 1 wherein said means for continuously changing the direction of said fundamental magnetic field is a current supply means for said means for generating a fundamental magnetic field which supplies offset current pulses.

8. A magnetic resonance diagnostic device comprising:
    means for generating a fundamental magnetic field of constant magnitude in which an examination subject is disposed;
    means for generating a plurality of gradient magnetic fields in which said examination subject is also disposed;
    means for detecting changes in the nuclear magnetic resonance of said examination subject from an equilibrium position; and
    means for continuously rotating the direction of said fundamental magnetic field for inducing said nuclear magnetic resonance changes.

9. A device as claimed in claim 8 wherein said means for rotating the direction of said fundamental magnetic field is a means for mechanically rotating said means for generating said fundamental magnetic field.

10. A device as claimed in claim 8 wherein said means for generating a fundamental magnetic field includes at least one fundamental magnetic field coil, and wherein said means for rotating includes a motor for mechanically rotating said fundamental magnetic field coil.

11. A device as claimed in claim 8 wherein said means for generating a fundamental magnetic field includes a magnetic field coil system and wherein said means for continuously rotating said fundamental magnetic field is a current supply connected to said fundamental magnetic field coil system for supplying current thereto in a form for electrically rotating said fundamental magnetic field.

12. A device as claimed in claim 11 wherein said current supply supplies phase-shifted currents to said fundamental magnetic field coil system.

13. A device as claimed in claim 11 wherein said current supply supplies chronologically offset current pulses to said fundamental magnetic field coil system.

14. A magnetic resonance diagnostic device comprising:
    at least one coil for generating a fundamental magnetic field of constant magnitude in which an examination subject is disposed;
    a plurality of orthogonal gradient magnetic field coils in which said examination subject is also disposed;
    a measurement coil for detecting changes in the nuclear magnetic resonance of said examination subject from an equilibrium position; and
    a motor drivingly connected to said coil for generating said fundamental magnetic field for continuously rotating said coil for inducing said nuclear magnetic resonance changes.

* * * * *